United States Patent [19]
Nakasuji et al.

[11] Patent Number: 5,933,217
[45] Date of Patent: Aug. 3, 1999

[54] ELECTRON-BEAM PROJECTION-MICROLITHOGRAPHY APPARATUS AND METHODS

[75] Inventors: Mamoru Nakasuji, Yokohama; Teruaki Okino, Kamakur, both of Japan

[73] Assignee: Nikon Corporation, Tokyo, Japan

[21] Appl. No.: 08/993,593

[22] Filed: Dec. 18, 1997

[30] Foreign Application Priority Data

Dec. 18, 1996 [JP] Japan .................................. 8-353744

[51] Int. Cl.⁶ .............................. G03B 27/42; A61N 5/00
[52] U.S. Cl. ............................................. 355/53; 250/492.2
[58] Field of Search .................................. 355/53, 67, 77; 250/492.2, 492.22, 491.1, 559, 559.3; 430/5, 30

[56] References Cited

U.S. PATENT DOCUMENTS

| | | | |
|---|---|---|---|
| 4,199,689 | 4/1980 | Takagawa | 250/492 A |
| 5,180,919 | 1/1993 | Oae et al. | 250/492.2 |
| 5,288,567 | 2/1994 | Sakamoto | 430/5 |
| 5,326,979 | 7/1994 | Kawasaki et al. | 250/492.2 |
| 5,449,915 | 9/1995 | Yamada et al. | 250/397 |
| 5,633,507 | 5/1997 | Pfeiffer et al. | 250/492.23 |
| 5,763,893 | 6/1998 | Nakasuji | 250/492.2 |

FOREIGN PATENT DOCUMENTS 7-107892  11/1995  Japan .

OTHER PUBLICATIONS

*Electron–Ion Beam Handbook*, Eiji Sugeta, Dec. 20, 1973 (pp. 27–28).

*Primary Examiner*—Safet Metjahic
*Assistant Examiner*—Hung Henry Nguyen
*Attorney, Agent, or Firm*—Klarquist Sparkman Campbell Leigh & Whinston, LLP

[57] ABSTRACT

Electron-beam projection-microlithography apparatus are disclosed for transferring a reticle pattern image to a substrate using an electron beam. The apparatus includes, along an optical axis in the trajectory direction of the electron beam, an electron gun, a field-limiting aperture for limiting the field of the electron beam emitted from the electron gun. A reticle can be positioned to receive and selectively transmit an electron beam transmitted by the field-limiting aperture. The apparatus further includes a blanking aperture positioned intermediate the field-limiting aperture and the reticle, the blanking aperture selectively operable to absorb the electron beam transmitted by the field-limiting aperture, a detector for detecting the current level of the electron beam absorbed by the blanking aperture, and a controller for adjusting time periods that a substrate is exposed to the electron beam transmitted by the reticle, wherein the time periods of exposure are adjusted according to the detected current level of the electron beam absorbed by the blanking aperture.

22 Claims, 2 Drawing Sheets

ELECTRON-BEAM PROJECTION-
MICROLITHOGRAPHY APPARATUS AND
METHODS

FIELD OF THE INVENTION

The invention pertains to electron-beam projection-microlithography apparatus and methods for transferring a pattern, as defined by a reticle or mask, onto a substrate.

BACKGROUND OF THE INVENTION

In electron-beam projection microlithography as used in the fabrication of semiconductor integrated circuits, a circuit pattern defined by a reticle or mask is irradiated with an electron beam emitted from an electron gun. Variable-shaping and cell-projection systems have been used as electron-beam delineation apparatus. Lanthanum hexaboride ($LaB_6$) is conventionally used in electron-gun cathodes that are operated in a relatively low-temperature environment, i.e., the operation temperature of a $LaB_6$ cathode is about 1000° C. to about 1600° C. These temperatures are significantly lower than the operating temperatures of conventional cathodes, such as tantalum (1900° C.) or tungsten (3000° C.), so that the electron gun components are in a low-temperature environment). $LaB_6$ electron guns typically possess a brightness of at least $10^5$ A/$cm^2$·sr and provide an emittance of several tens of $\mu$m·mrad (at an acceleration voltage of 30 kV).

Conventional variable-shaping and cell-projection electron-beam delineation apparatus cannot provide the high resolution and integration densities necessary to produce the semiconductor integrated circuits demanded in recent years. Consequently, there is a current need for electron-beam projection apparatus that provide both high-resolution and high-throughput electron exposure of the substrate.

There has been recent interest in projection apparatus that perform pattern-image transfer using a mask or reticle having a relatively large optical field representing one die that is divided into field segments ("mask subfields") to be individually projected onto the substrate surface. The die pattern image is typically transferred using a "step-and-repeat" transfer scheme in which individual mask subfields are sequentially transferred to corresponding "transfer subfields" on the substrate. The transfer subfields are produced on the substrate surface in locations relative to each other such that the transfer subfields are "stitched" together in the correct order and alignment to reproduce the entire die pattern on the substrate surface (as described, e.g., in U.S. Pat. No. 5,260,151, incorporated herein by reference).

Having to incrementally transfer multiple subfields per die requires more time than transferring the entire die pattern in a single exposure; thus, the former can have a slower throughput than the latter. In order to increase throughput in the subfield-by-subfield step-and-repeat scheme, increasing the size of the mask subfields transferred per exposure (and thus reducing the number of mask subfields per die) has been considered. For step-and-repeat lithography, the required width of a single mask subfield can be several hundreds of square micrometers or more. Such a mask subfield is many times larger than the mask subfields used with conventional electron-beam projection delineation apparatus. Larger mask subfields require an electron gun capable of producing an irradiating electron beam having a uniform intensity distribution over a wider field than is obtainable with currently available equipment.

Two key parameters of an electron gun are its emittance and brightness. For step-and-repeat lithography, an electron gun can be used having low brightness and high emittance. However, it is difficult to decrease the brightness and/or increase the emittance of an electron gun that operates in a space-charge limited condition or a temperature-limited condition (i.e., a low-temperature electron-gun environment). An electron gun used for step-and-repeat lithography must provide a brightness of about $10^3$ A/$cm^2$·sr or less and an emittance of several thousands of $\mu$m·mrad at an acceleration voltage of 100 kV or greater. These specifications are about 1/100 of the brightness and about 100× the emittance provided by conventional electron guns.

Additionally, electron guns that operate under a temperature-limited condition typically experience fluctuations in the emission current due to fluctuations in the cathode temperature. Fluctuations in the emission current cause variations in the electron dosage to which a substrate surface is exposed. Excessive fluctuations in the electron dosage delivered to a substrate surface (such as the electron dosage delivered to a layer of resist on a wafer substrate) result in imprecise transfer of pattern images.

Accordingly, there is a need to minimize fluctuations in electron dosages delivered to the substrate surface in order to perform high-precision pattern-image transfers using electron guns operated under temperature-limited conditions. Conventional electron guns provide electron dosages having a stability level of about 3% per hour. A stability of 0.5% or less per hour is desirable.

Additionally, there is a need for electron-beam projection-microlithography apparatus that generate electron fluxes at high emittance and low brightness while providing high throughput with uniform electron-flux irradiation intensity of the reticle or mask and, ultimately, of the substrate surface.

SUMMARY OF THE INVENTION

In light of the foregoing deficiencies of the prior art, the present invention provides electron-beam projection-microlithography apparatus ("electron-beam apparatus") that transfer a pattern image, as defined by a reticle or wafer, onto a substrate using electron beams. The electron-beam apparatus are capable of achieving a pattern-image resolution sufficient for fabricating, e.g., four-gigabit DRAMS and other semiconductor devices requiring very small feature sizes, with high throughput, and are capable of performing high-precision pattern-image transfer with constant and precise electron doses to the substrate surface.

According to a preferred embodiment, an electron-beam apparatus according to the invention comprises an electron gun, a field-limiting aperture that limits the field of an electron flux emitted from the electron gun to the desired subfield dimensions. The electron-beam apparatus further comprises a blanking aperture preferably positioned between the field-limiting aperture and a reticle or mask defining a pattern to be transferred to the sensitive surface of the substrate. The electron-beam apparatus is operable to determine the electron dose that is emitted from the electron gun. The electron dose is absorbed by the blanking aperture during a blanking period. The electron-beam apparatus further comprises a controller for adjusting the transfer exposure time to deliver a predetermined and precise electron dose to the substrate surface.

The electron gun comprises a cathode (preferably $LaB_6$) for emitting an electron flux. The electron flux emitted from the electron gun converges at a crossover. The cathode may be operated in a "real-crossover mode" or a "virtual-crossover mode." When operated under the real-crossover mode, the real crossover, located a distance downstream from the cathode, is used as the image in the electron-beam apparatus. In the case of the virtual-crossover mode cathode operation, a virtual crossover located a short distance upstream or behind the cathode, is used as the image. An electron flux propagates downstream from the crossover at a specific angle of divergence.

The dimensions of the electron-beam crossover and the angle of divergence of the electron flux propagating from the crossover typically are not constant; rather, they can continually fluctuate. Notwithstanding the fluctuation, the substrate surface (typically coated with a layer of electron-sensitive resist) must be exposed to a precise dose of electrons to produce high-resolution integrated circuits. In addition, both the current of the electron-flux entering the field-limiting aperture and the portion of the electron flux that is blocked by the field-limiting aperture can fluctuate. After excess electron flux is blocked by the field-limiting aperture, the electron-flux transmitted by the reticle enters the blanking aperture.

According to one embodiment, to correct for fluctuations, the time period during which the substrate is not exposed to electron irradiation is controlled so that the pattern image is always transferred with the same predetermined dose of electrons being incident upon the substrate surface.

DETAILED DESCRIPTION OF THE INVENTION

Figure 3:
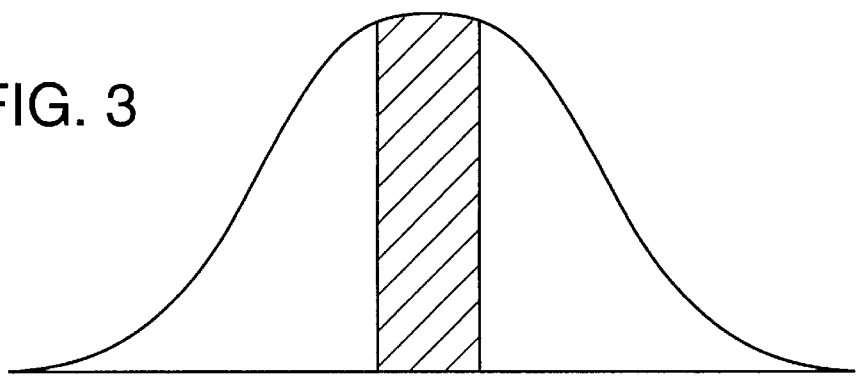
FIG. 3 is a electron flux intensity profile at the crossover shown in FIG. 2, illustrating the electron flux uniform intensity region.

In general, an electron-beam apparatus according to the present invention preferably comprises a critical-illumination optical system that forms on a reticle an enlarged image of a crossover produced by an electron gun. The apparatus also comprises a first aperture on which the intensity distribution of the electron flux is angle-dependent. The first aperture determines the electron-flux intensity. The enlarged image of the crossover formed on the reticle is independent of the intensity distribution on the cathode surface (which is typically Gaussian, as illustrated in FIG. 3). For Köhler-illumination systems or critical Köhler illumination systems, the electron flux produced on the aperture is dependent on the intensity distribution at the cathode surface, as illustrated by the solid line in FIG. 4. If the electron-flux irradiation distribution at the reticle is uniform, then the consistency and uniformity of the exposure is not significantly affected by any distribution of downstream electron flux at the aperture (that determines the transverse dimensions of the beam), even if the flux is abnormal. Accordingly, the apparatus of the present invention provides a uniform electron-flux irradiation distribution at the reticle by controlling any variations in the electron-flux density.

Figure 4:
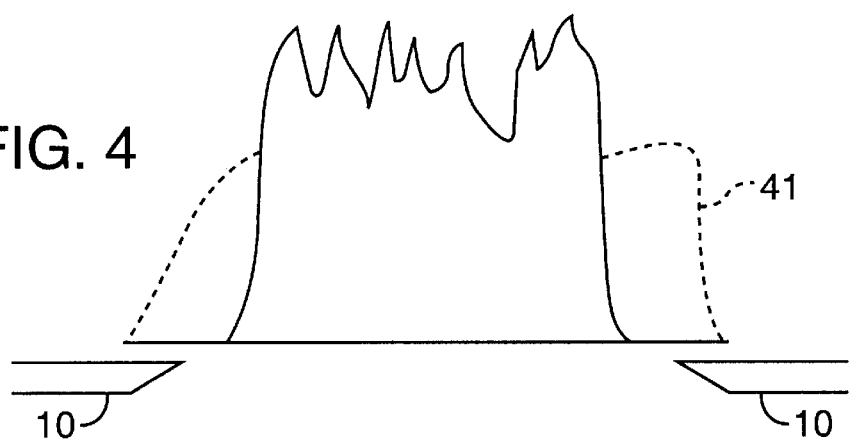
FIG. 4 illustrates an electron flux distribution at the field-limiting aperture of a Köhler or critical Köhler illumination system (shown by the solid line) and a critical illumination system (shown by the dashed line) according to an electron-beam projection-microlithography apparatus of the present invention.

Although the present invention is described primarily with reference to use of a critical-illumination system for a reticle (a typical illumination of which is illustrated as dashed line 41 in FIG. 4), it will be understood by persons skilled in the art that the apparatus and methods of the present invention apply equally well to an electron-beam mask.

Figure 1:
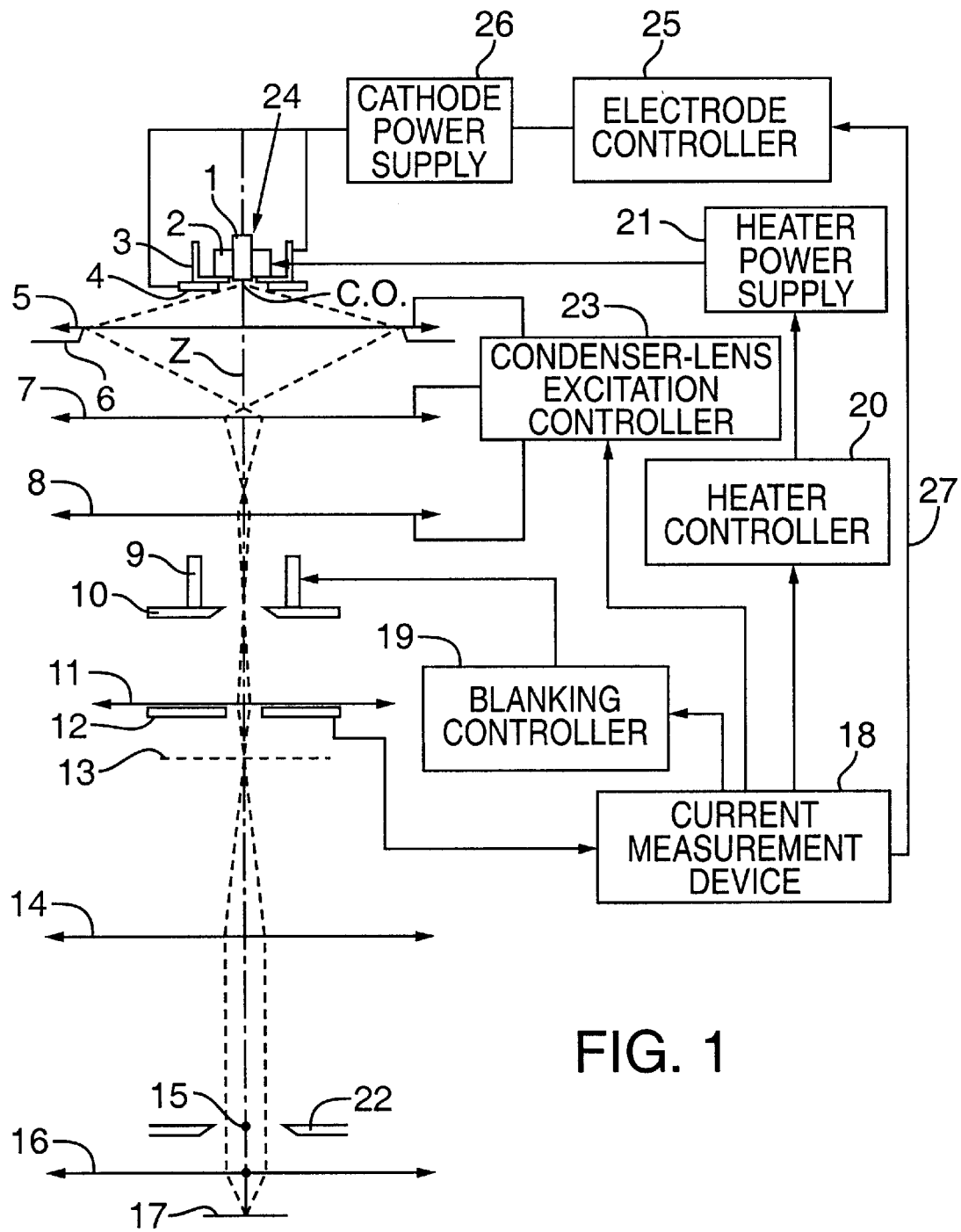
FIG. 1 is a schematic diagram of a preferred embodiment of the electron-beam projection-microlithography apparatus according to the present invention.

FIG. 1 illustrates a preferred embodiment of an electron-beam apparatus according to the present invention. The optical system of the electron-beam apparatus is arranged along an optical-axis Z, as shown in FIG. 1.

The FIG. 1 embodiment comprises an electron gun 24, a field-limiting aperture 10 that limits the field of an electron flux emitted from the electron gun 24, and a blanking aperture 12. A reticle 13 is placed as shown relative to the blanking aperture. Thus, the blanking aperture 12 is situated between the field-limiting aperture 10 and the reticle 13. The FIG. 1 apparatus can measure the current of the electron-flux emitted from the electron gun and absorbed by the blanking aperture 12 during a blanking procedure. The FIG. 1 apparatus is also operable to adjust the transfer exposure time so as to deliver a predetermined, precise electron dose to a substrate surface 17.

Figure 2:
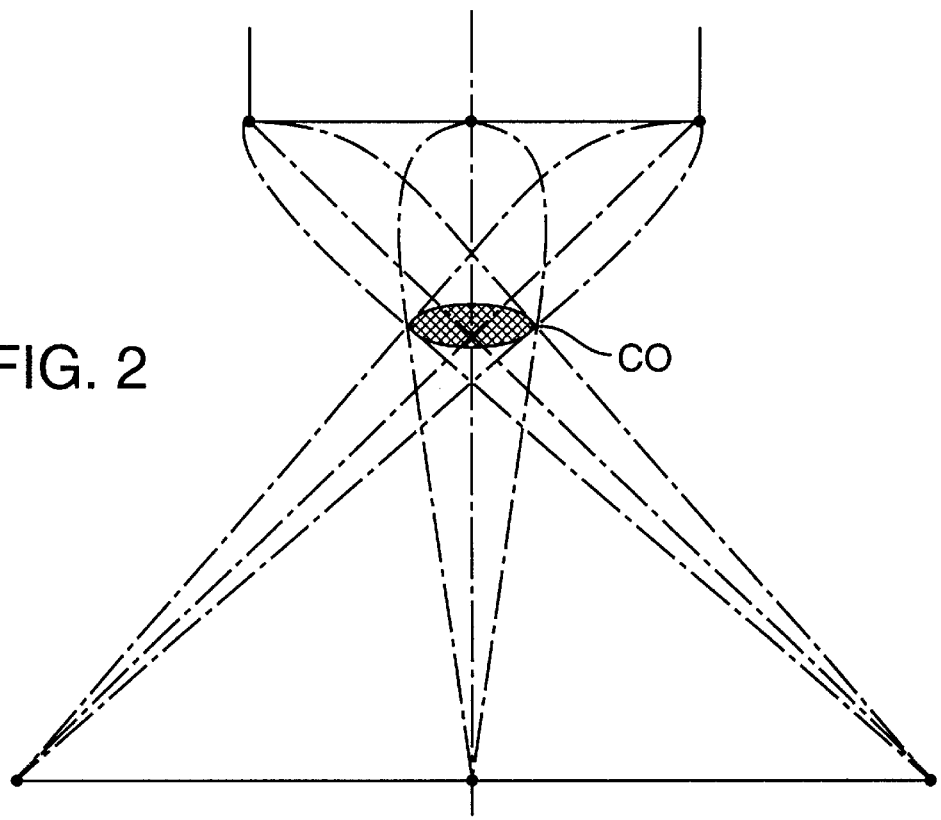
FIG. 2 illustrates the relationship between a cathode crossover CO and a cathode image of an electron gun according to the present invention.

More specifically, referring to FIG. 1, the electron gun 24 comprises a cathode 1, a heater 2, a Wehnelt grid 3, and an anode 4. Preferably, the cathode 1 comprises $LaB_6$ or any equally suitable material, such as metal oxides (e.g., calcium oxides, strontium oxides, barium oxides, cesium oxides, beryllium oxides, etc.), as known to persons skilled in the art. The cathode 1 preferably has a large-diameter electron-emission surface (i.e., preferably at least 2 mm). The electron flux emitted from the cathode 1 forms a crossover CO immediately adjacent (downstream) the cathode 1. FIG. 2 illustrates the relationship between the cathode crossover CO and a resulting cathode image 41. An electron flux propagates at a particular angular distribution from the crossover CO.

The heater 2 of the electron gun 24 preferably comprises a heating coil or a graphite material (not shown) surrounding the cathode 1. The heater 2 is connected to a power supply 21. Predetermined electrical potentials are applied to the cathode 1, the Wehnelt grid 3, and an anode 4 via an electrode controller 25. A negative voltage is applied to the cathode 1 and to the Wehnelt grid 3, and a positive voltage (i.e., an "acceleration voltage") is applied to the anode 4 (i.e., between the anode and cathode).

Condenser lenses 5, 7, 8 are positioned in series along the Z axis downstream of the electron gun 24. The electron flux propagating divergently from the crossover CO passes through each of the condenser lenses 5, 7, 8. A first aperture 6 is preferably situated in the first condenser lens 5 to eliminate any electron flux emitted from the electron gun 24 at an unsuitably large angle.

An enlarged image of the crossover CO is formed on the field-limiting aperture 10. The field-limiting aperture 10 shapes the electron flux to a suitable transverse profile having desired dimensions for a mask subfield on the reticle 13. A condenser lens 11, situated between the field-limiting aperture 10 and the reticle 13, forms an image of the field-limiting aperture 10 on the reticle 13. The electron flux passing through the reticle 13 is formed into a collimated electron beam by a projection lens 14. The electron flux is then focused onto the substrate surface 17 by a projection lens 16.

The substrate may comprise a semiconductor wafer or any other suitable workpiece. Typically, a layer of electron-sensitive resist has been applied to the substrate surface 17. The resist is exposed to the electron-flux dose transmitted through the reticle 13, thereby transferring the reticle-pattern image to the resist.

A blanking deflector 9 is preferably positioned immediately upstream of the field-limiting aperture 10, and a blanking aperture 12 is positioned near (immediately downstream of) the condenser lens 11. A current-measurement device 18 is connected to the blanking aperture 12 and is operable to determine the electron flux current (or electron dose) absorbed by the blanking aperture 12. The electron flux is deflected by the blanking deflector 9 to impinge on and be absorbed by the blanking aperture 12 rather than pass through the blanking aperture. When the electron flux is blanked in such a manner, it does not propagate to the substrate surface 17 but rather is incident upon an upstream surface of the blanking aperture 12. A portion of the electron flux incident upon the blanking aperture 12 is absorbed and the current of the incident electron flux is determined by the current-measurement device 18.

The blanking deflector 9 and the field-limiting aperture 10 are preferably positioned immediately adjacent one another. The transverse dimensions of the electron flux at the field-limiting aperture 10 are larger than the dimensions of the opening of the field-limiting aperture 10. Accordingly, the electron flux passing through the field-limiting aperture 10 has a relatively constant intensity, even during the blanking procedure.

A second aperture 22 is positioned intermediate two projection lenses 14, 16 downstream of the reticle 13, preferably at a point 15 located a distance upstream of the lens 16 equal to the distance between the two projection lenses 14, 16 divided by the reduction factor. The second aperture 22 is sized to allow all of the electron flux transmitted by the field-limiting aperture 10 to pass through the second aperture 22 and be incident upon the projection lens 16.

A predetermined desired electron-dosage value is stored by the current-measurement device 18. The current-measurement device 18 comprises electronic circuitry for measuring the actual current of the electron flux incident upon the blanking aperture 12 during a "blanking" period so as to determine the actual electron dosage and compare it to the predetermined desired value. The current-measurement device 18 then outputs an electrical signal corresponding to the predetermined desired electron dosage minus the actual electron dosage as measured at the blanking aperture. The signal sent by the current-measurement device 18 is received by a blanking controller 19 or a heater controller 20.

The blanking controller 19, when in an exposure-time control mode, increases or decreases the blanking release time, i.e., the time period that a transfer subfield (corresponding to the irradiated mask subfield on the substrate surface 17) is exposed to the electron flux, based on the signal received from the current-measurement device 18. Typically, the blanking release time is lengthened whenever the measured electron-flux current is low relative to the desired level, and the blanking release time is shortened whenever the measured electron-flux current is high relative to the desired level, so that each transfer subfield on the substrate surface 17 consistently receives a precise electron dosage at the proper level.

The heater controller 20 comprises electronic circuitry (e.g., a proportional, integral, and derivative ("PID") control system) for adjusting the voltage applied to the heater 2 by the power supply 21. Accordingly, the temperature of the cathode 1, and ultimately the electron-flux current emitted from the cathode, are controlled so as to be constant. Control of the electron-flux current by the heater controller 20 by the blanking controller 19 permits various control schemes. For example, the electron-flux current can be maintained at a constant value by using one or the other controller 19, 20. Alternatively, the electron-flux current can be maintained by feeding long-term fluctuations in the electron-flux current back to regulate the heater voltage, while feeding short-term fluctuations back to regulate the blanking power supply.

Especially whenever the electron gun is operated under low-temperature conditions, the signal output by the current-measurement device 18 can be routed to an electrode controller 25. The electrode controller 25 is operable to control, e.g., the Wehnelt voltage or the anode voltage and thereby stabilize the electron-flux current emitted by the electron gun 24.

As an alternative to, or in addition to, the blanking-time control scheme discussed above, the electron-flux current (i.e., the irradiation density) transmitted by the field-limiting aperture 10 can be controlled by setting the magnification ratio of the condenser lenses 5, 7, 8 in a coordinated manner such that this group of lenses functions as a zoom lens. To such end, the output signal from the current-measurement device 18 is sent to a condenser-lens excitation controller 23 that correspondingly varies the electrical energy individually supplied to the condenser lenses 5, 7, 8 to change the magnification of the image of the crossover projected on the field-limiting aperture.

A first alternative embodiment of an electron-beam apparatus according to the invention comprises all the components discussed above and utilizes the controller 25 for performing feedback control of a power supply 26 for the cathode. Thus, the dose of electrons to which the substrate surface is exposed is consistently at a precise, predetermined level.

More particularly, during operation of the cathode, measurement of the cathode temperature to an accuracy of at least ±1° C. is difficult because the cathode temperature is typically approximately 1,200° C. With an apparatus according to the present invention, the current of the electron flux rather than the cathode temperature is measured. Power output by the cathode power supply 26 is regulated by the controller 25 to eliminate, as much as possible, fluctuations in the current of the electron flux emitted from the electron gun 24. Thus, especially whenever the cathode is operated at a relatively low-temperature, the current and ultimately the dose of electron flux is controlled by performing feedback control (e.g., such as by a proportional, integral, and derivative ("PID") circuit) of the cathode power supply 26 via a feedback conduit 27 from the current-measuring device 18.

A second alternative embodiment of an electron-beam apparatus according to the present invention comprises all the components discussed above and further utilizes the controller 25 for performing feedback control of the Wehnelt voltage or the anode voltage (or both) of the electron gun 24 so that the current of the electron flux propagating from the electron gun 24 (and, thus, ultimately the electron dosage transmitted to the substrate) precisely equals a predetermined value. Especially whenever the electron gun 24 is operated at a low-temperature and the electron-flux current is undesirably high, either a Wehnelt bias is applied or the anode voltage is increased. Especially whenever the electron-flux current is undesirably low, the anode voltage is decreased.

A third alternative embodiment of an electron-beam apparatus according to the the present invention comprises all the components discussed above and further utilizes the controller 25 for maintaining the quantity or dose of electron flux to which a substrate surface is exposed. This is performed by feeding back long-term fluctuations of the detected electron-flux current to the cathode power supply 26, and feeding back short-term fluctuations in the electron-flux current to the Wehnelt voltage, to the condenser-lens excitation voltage, or to the anode voltage, or by adjusting the electron-flux exposure time.

There is a time-delay factor in controlling the temperature of the cathode via the cathode power supply to ultimately control the quantity or dose of electrons. Accordingly, the traceability of the short-term fluctuations is typically difficult and inaccurate. However, since the control range of the dose of electrons is broadened, there is a canceling effect of the electron dose fluctuations that have large cumulative values. On the other hand, changes in the Wehnelt voltage, the condenser-lens excitation voltage, the anode voltage, or the electron-flux exposure time, have relatively quick responsiveness and are suited to correct short-term fluctuations in the electron dose. Accordingly, excellent control of the electron dose is accomplished by combining the scheme of changing cathode temperature and the scheme of adjusting the energy applied to any of the electrodes, the condenser lens, or the electron-flux exposure time.

As is clear from the above description, this invention provides an electron-beam apparatus that is able to form high-density, high-resolution pattern images to facilitate production of integrated circuitry, such as 4-Gigabit DRAMs, with high throughput. Further, the apparatus of the present-invention performs high-precision electron-beam pattern transfer by producing a precise electron dose to the substrate surface. Additionally, although the cathode may be negatively affected by certain actions such as oxidation, contamination, etc., that can cause marked decreases in the emission current from those affected portions of the cathode, the apparatus and methods of the present invention still provide transfer of a pattern image with a precise electron dose being applied to each subfield of the substrate surface.

Having illustrated and described the principles of the invention with multiple preferred embodiments, it should be apparent to those skilled in the art that the invention can be modified in arrangement and detail without departing from such principles. We claim all the modifications, alternatives, and equivalents coming within the spirit and scope of the following claims.

What is claimed is:

1. An electron-beam projection-microlithography apparatus for transferring a reticle pattern image to a substrate using an electron beam, the apparatus comprising along an optical axis in the trajectory direction of the electron beam:
   (a) an electron gun for emitting an electron beam having a current level;
   (b) a field-limiting aperture for limiting the field of the electron beam emitted from the electron gun and for transmitting the electron beam to a reticle;
   (c) a blanking aperture positioned intermediate the field-limiting aperture and the reticle, the blanking aperture selectively operable to absorb the electron beam transmitted by the field-limiting aperture;
   (d) a detector for detecting the current level of the electron beam absorbed by the blanking aperture; and
   (e) a controller for adjusting time periods during which the substrate is exposed to the electron beam transmitted by the reticle, the time periods of exposure being adjusted according to the detected current level of the electron beam absorbed by the blanking aperture.

2. The apparatus of claim 1, wherein the electron gun is operated under a temperature-limited condition.

3. An electron-beam projection-microlithography apparatus for transferring a reticle pattern image to a substrate using an electron beam, the apparatus comprising along an optical axis in the trajectory direction of the electron beam:
   (a) an electron gun for emitting an electron beam for generating a real electron beam crossover or a virtual electron beam crossover;
   (b) a field-limiting aperture for limiting the field of the electron beam emitted from the electron gun and for transmitting the electron beam to a reticle;
   (c) a blanking aperture positioned intermediate the field-limiting aperture and the reticle, the blanking aperture being selectively operable to absorb the electron beam transmitted by the field-limiting aperture; and
   (d) two condenser lenses positioned downstream of the electron gun for magnifying and imaging the real electron beam crossover or the virtual electron beam crossover on the field-limiting aperture.

4. The apparatus of claim 3, wherein a numerical aperture varies whenever the two condenser lenses vary the magnification of the real electron beam crossover or the virtual electron beam crossover.

5. The apparatus of claim 1, further comprising a critical-illumination optical system.

6. The apparatus of claim 1, further including a condenser lens positioned intermediate the field limiting aperture and the blanking aperture.

7. The apparatus of claim 1, further including at least two condenser lenses positioned intermediate the electron gun and the field-limiting aperture.

8. An electron-beam projection-microlithography apparatus for transferring a reticle pattern image to a substrate using an electron beam, the apparatus comprising along an optical axis in the trajectory direction of the electron beam:
   (a) an electron gun for emitting an electron beam having a current level, the electron gun comprising an anode, a cathode, and a cathode-heating power supply;
   (b) a field-limiting aperture for limiting the field of the electron beam emitted from the electron gun and for transmitting the electron beam to a reticle;
   (c) a blanking aperture positioned intermediate the field-limiting aperture and the reticle, the blanking aperture being selectively operable to absorb the electron beam transmitted by the field-limiting aperture;
   (d) a detector for detecting the current level of the electron beam absorbed by the blanking aperture; and
   (e) a controller for performing feedback control of the cathode heating power supply so that the detected current of the electron beam is equal to a preselected current value.

9. The apparatus of claim 8, wherein the controller for performing feedback control comprises a proportional, integral, and differential controller.

10. The apparatus of claim 8, wherein the electron gun comprises a cathode and a cathode-heating power supply and operates the cathode under a temperature-limited condition.

11. The apparatus of claim 8, further comprising a critical-illumination optical system.

12. The apparatus of claim 8, wherein the cathode comprises a metal oxide.

13. The apparatus of claim 8, wherein the cathode comprises lanthanum hexaboride.

14. The apparatus of claim 8, further including at least two condenser lenses for magnifying a crossover image onto the field-limiting aperture.

15. An electron-beam projection-microlithography apparatus for transferring a reticle pattern image to a substrate using an electron beam, comprising, along an optical axis in the trajectory direction of the electron beam:
   (a) an electron gun for emitting an electron beam having a current level, the electron gun comprising an anode to which a first electric potential is applied, a cathode to which a second electric potential is applied, a Wehnelt grid to which a third electric potential is applied, and a cathode-heating power supply;
   (b) a field-limiting aperture for limiting the field of the electron beam emitted from the electron gun and for transmitting the electron beam to a reticle;
   (c) a blanking aperture positioned intermediate the field-limiting aperture and the reticle, the blanking aperture being selectively operable to either absorb the electron beam transmitted by the field-limiting aperture or to pass at least a portion of the electron beam to a substrate;
   (d) a detector for detecting the current level of the electron beam absorbed by the blanking aperture; and
   (e) a controller for varying the electric potential of the Wehnelt grid or varying the electric potential of the anode, so that the detected current of the electron beam is equal to a preselected current value.

16. The apparatus of claim 15, wherein the controller for performing feedback control comprises a proportional, integral, and differential controller.

17. The apparatus of claim 15, wherein the electron gun operates under a space-charge limited condition.

18. The apparatus of claim 15, further comprising a critical-illumination optical system.

19. The apparatus of claim 15, further including at least two condenser lenses for magnifying a crossover image onto the field-limiting aperture.

20. The apparatus of claim 15, further including a condenser lens positioned intermediate the field-limiting aperture and the blanking aperture.

21. An electron-beam projection-microlithography apparatus for transferring a reticle pattern image to a substrate using an electron beam, comprising, along an optical axis in the trajectory direction of the electron beam:
   (a) an electron gun for emitting an electron beam having a current level, the electron gun comprising an anode adapted to have an electric potential applied thereto, a cathode adapted to have an electric potential applied thereto, a Wehnelt grid adapted to have an electric potential applied thereto, and a cathode-heating power supply;
   (b) a field-limiting aperture for limiting the field of the electron beam emitted from the electron gun and for passing at least a portion of the electron beam to a reticle;
   (c) a blanking aperture positioned intermediate the field-limiting aperture and the reticle, the blanking aperture being selectively operable to absorb the electron beam transmitted by the field-limiting aperture or to pass at least a portion of the electron beam to a substrate;
   (d) a condenser lens positioned intermediate the field-limiting aperture and the blanking aperture, the condenser lens being adapted to have an electric potential applied thereto;
   (e) a detector for detecting the current level of the electron beam absorbed by the blanking aperture; and
   (f) a controller for performing feedback control of long-term fluctuation of the detected current of the electron beam to the cathode heating power supply, and feedback control of short-term fluctuation to the electric potential of the Wehnelt grid, the electric potential of the condenser lens, the electric potential of the anode, or to a substrate exposure time period so that the detected current of the electron beam is equal to a preselected current value.

22. An electron-beam projection-microlithography apparatus for transferring a reticle pattern image to a substrate using an electron beam, the apparatus comprising along an optical axis in the trajectory direction of the electron beam:
   (a) an electron gun for emitting an electron beam having a current level, the electron gun comprising an anode, a cathode, and a cathode-heating power supply;
   (b) a field-limiting aperture for limiting the field of the electron beam emitted from the electron gun and for transmitting the electron beam to a reticle;
   (c) a blanking aperture positioned intermediate the field-limiting aperture and the reticle, the blanking aperture being selectively operable to absorb the electron beam transmitted by the field-limiting aperture;
   (d) a detector for detecting the current level of the electron beam absorbed by the blanking aperture;
   (e) two condenser lenses positioned intermediate the electron gun and the field limiting aperture, the condenser lenses adapted to have an electric potential applied thereto; and
   (f) a condenser-lens excitation controller for controlling the electric potential applied to the condenser lenses so that the detected current of the electron beam is equal to a preselected current value.

* * * * *